US009379671B2

(12) United States Patent
Wimpenny

(10) Patent No.: US 9,379,671 B2
(45) Date of Patent: Jun. 28, 2016

(54) PARALLEL CORRECTION AMPLIFIER

(71) Applicant: SnapTrack, Inc., San Diego, CA (US)

(72) Inventor: Gerard Wimpenny, Cambourne (GB)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 14/608,898

(22) Filed: Jan. 29, 2015

(65) Prior Publication Data
US 2015/0137893 A1 May 21, 2015

Related U.S. Application Data

(63) Continuation of application No. 13/512,290, filed as application No. PCT/EP2010/068233 on Nov. 25, 2010.

(30) Foreign Application Priority Data

Nov. 27, 2009 (GB) .................................. 0920869.5

(51) Int. Cl.
*H03G 3/00* (2006.01)
*H03F 1/02* (2006.01)
*H03F 3/21* (2006.01)
*H03F 3/19* (2006.01)

(52) U.S. Cl.
CPC ............ *H03F 1/0233* (2013.01); *H03F 1/0227* (2013.01); *H03F 3/19* (2013.01); *H03F 3/211* (2013.01); *H03F 2200/451* (2013.01); *H03F 2200/504* (2013.01); *H03F 2203/21193* (2013.01)

(58) Field of Classification Search
CPC ........................................................ H03G 3/00
USPC .......................... 330/127, 297, 10; 455/127.1
See application file for complete search history.

(56) References Cited

U.S. PATENT DOCUMENTS

| 5,696,412 | A | 12/1997 | Iannello |
| 5,942,938 | A | 8/1999 | Myers et al. |
| 7,058,373 | B2 | 6/2006 | Grigore |
| 7,783,269 | B2 | 8/2010 | Vinayak et al. |
| 2003/0034823 | A1 | 2/2003 | Hiraki et al. |
| 2003/0148792 | A1 | 8/2003 | Kimball et al. |
| 2008/0258831 | A1 | 10/2008 | Kunihiro et al. |

(Continued)

FOREIGN PATENT DOCUMENTS

| CN | 1759532 A | 4/2006 |
| CN | 1879070 A | 12/2006 |
| GB | 2398648 A | 8/2004 |

(Continued)

OTHER PUBLICATIONS

"Related Chinese Patent Application No. CN 2010 800 609 927", "Office Action", Jul. 22, 2014, Publisher: SIPO, Published in: CN.

(Continued)

*Primary Examiner* — Patricia T Nguyen

(57) ABSTRACT

A power supply stage and a method of controlling the same comprising: a means for generating an intermediate supply signal in dependence on a reference signal representing a desired power supply; and a plurality of adjusting means, each adapted to generate an adjusted supply signal tracking the reference signal, in dependence on the generated intermediate supply signal and the reference signal.

13 Claims, 3 Drawing Sheets

(56) References Cited

U.S. PATENT DOCUMENTS

2013/0002346 A1 1/2013 Wimpenny
2013/0200949 A1 8/2013 Wilson

FOREIGN PATENT DOCUMENTS

| | | | |
|---|---|---|---|
| GB | 2409115 | A | 6/2005 |
| GB | 2459324 | A | 10/2009 |
| JP | 2006093872 | A | 4/2006 |
| JP | 2006514472 | A | 4/2006 |
| JP | 2007215158 | A | 8/2007 |
| WO | 2004075398 | A1 | 9/2004 |
| WO | 2007080741 | A1 | 7/2007 |

OTHER PUBLICATIONS

"Related Japanese Application No. JP 2012-540432", "Office Action", Nov. 11, 2014, Publisher: JPO, Published in: JP.

Barrell, Robert, "GB Application No. 0920869.5 Search Report Mar. 18, 2010", , Publisher: UK IPO, Published in: GB.

Lorenzo, Carlos, "PCT Application No. PCT/EP2010/068233 International Search Report May 6, 2011", , Publisher: PCT, Published in: PCT.

Yolaine Cussac, "International Preliminary Report on Patentability", Jun. 7, 2012, Publisher: PCT, Published in: EP.

"Related U.S. Appl. No. 13/512,290", "Non Final Office Action", Mar. 17, 2014, Publisher: USPTO, Published in: US.

US 9,379,671 B2

PARALLEL CORRECTION AMPLIFIER

The pending application is a continuation of U.S. Application Ser. No. 13/512,290, filed on Sep. 19, 2012, which issued as U.S. Pat. No. 9,209,751, which is a National Stage Entry of PCT/EP2010/068233 filed on Nov. 25, 2010, which claims priority to Great Britain Patent Application No. 0920869.5, filed on Nov. 27, 2009. Great Britain Patent Application No. 0920869.5 is incorporated herein by reference.

FIELD OF THE INVENTION

The invention is directed to a modulated supply stage comprising a switched supply and a correction stage for correcting an error in the switched supply to generate a modulated supply voltage. The invention is particularly, but not exclusively, concerned with the provision of a modulated supply voltage to an RF amplifier.

BACKGROUND OF THE INVENTION

United Kingdom Patent No. 2398648 describes a particularly advantageous modulated supply stage comprising a switched supply stage and an error correction stage. The switched supply stage selects one of a plurality of supply voltages in dependence on a reference signal representing, in the preferred implementation, a signal to be amplified by an RF (radio frequency) amplifier. The error correction stage comprises an error correction amplifier and provides an error correction voltage for a correction of an error in a switched supply voltage, to deliver a more accurate supply voltage to the RF amplifier.

The error correction stage is provided to enable fast correction of the switched supply stage. There is a trade-off between output power and bandwidth. An increase in output power tends to result in a reduction in bandwidth due to increased parasitic elements of the higher power correction amplifier and combining components.

Further, when a transformer is advantageously used to combine the switched supply voltage and the error correction voltage, the increase in transformer size necessary for increased power handling results in increased leakage inductance and inter-winding capacitance, and a consequent loss of bandwidth.

It is an aim of the invention to provide an improvement to the advantageous modulated power supply described in United Kingdom Patent No. 2398648, and particularly to provide improvements in the error correction stage.

SUMMARY OF THE INVENTION

In accordance with the invention there is provided a power supply stage comprising: a means for generating an intermediate supply signal in dependence on a reference signal representing a desired power supply; and a plurality of adjusting means, each adapted to generate an adjusted supply signal tracking the reference signal, in dependence on the generated intermediate supply signal and the reference signal.

There may be further provided a current summing means for summing the plurality of generated adjusted supply signals to provide an output power supply voltage with higher output current capability. The higher output current capability is preferably a current capability which is higher than the current capability of any individual adjusted supply signal.

The output power supply stage may be provided as a power supply signal to an RF amplifier.

Each adjusted supply signal may be provided as a power supply signal to an RF amplifier stage comprising a corresponding plurality of RF amplifiers, each adjusted supply signal providing a power supply for one RF amplifier.

The means for generating a supply signal may be adapted to select one of a plurality of power supply voltages in dependence on the reference signal.

There may be provided a plurality of combining means for combining the supply signal with each of a plurality of correction signals in order to generate the plurality of adjusted supply signals. Each adjusting means may include a correction amplifier for generating a correction signal, wherein each correction amplifier receives as an input a signal representing a difference between the reference signal and the sum of the adjusted supply signals. Each combining means may comprise a transformer. The supply signal may be connected to a tap of a primary winding of each transformer, and a respective correction signal is connected to a tap of a secondary winding of each transformer, an adjusted supply signal being formed on another tap of the secondary winding of each transformer.

The summing means may comprise a connection between the taps of the transformers on which the adjusted supply signals are formed.

The intermediate supply signal may be a voltage supply signal and the adjusted supply signal is a voltage supply signal.

In accordance with the invention there is provided a method of generating an output supply signal comprising: generating an intermediate supply signal in dependence on a reference signal representing a desired power supply; and generating a plurality of adjusted supply signals tracking the reference signal in dependence on the intermediate supply signal and the reference signal.

The method may further comprising the step of providing the plurality of adjusted supply voltages as power supply signals to a corresponding plurality of parallel connected amplifiers.

The method may further comprise the step of summing the plurality of adjusted supply signals to provide an output power supply voltage.

The method may further comprise the step of providing the summed adjusted supply voltages as a power supply signal to an amplifier.

The step of generating an intermediate supply signal may comprise selecting one of a plurality of power supply voltages in dependence on the reference signal.

The method may further comprise the step of correction signals representing an error between the reference signal and an output signal, generating a plurality of amplified versions of the reference signal, and combining each amplified version with the intermediate supply signal to generate the plurality of adjusted supply signals.

BRIEF DESCRIPTION OF THE DRAWINGS

The invention will now be described with reference to the accompanying drawings in which.

DETAILED DESCRIPTION

Figure 1:
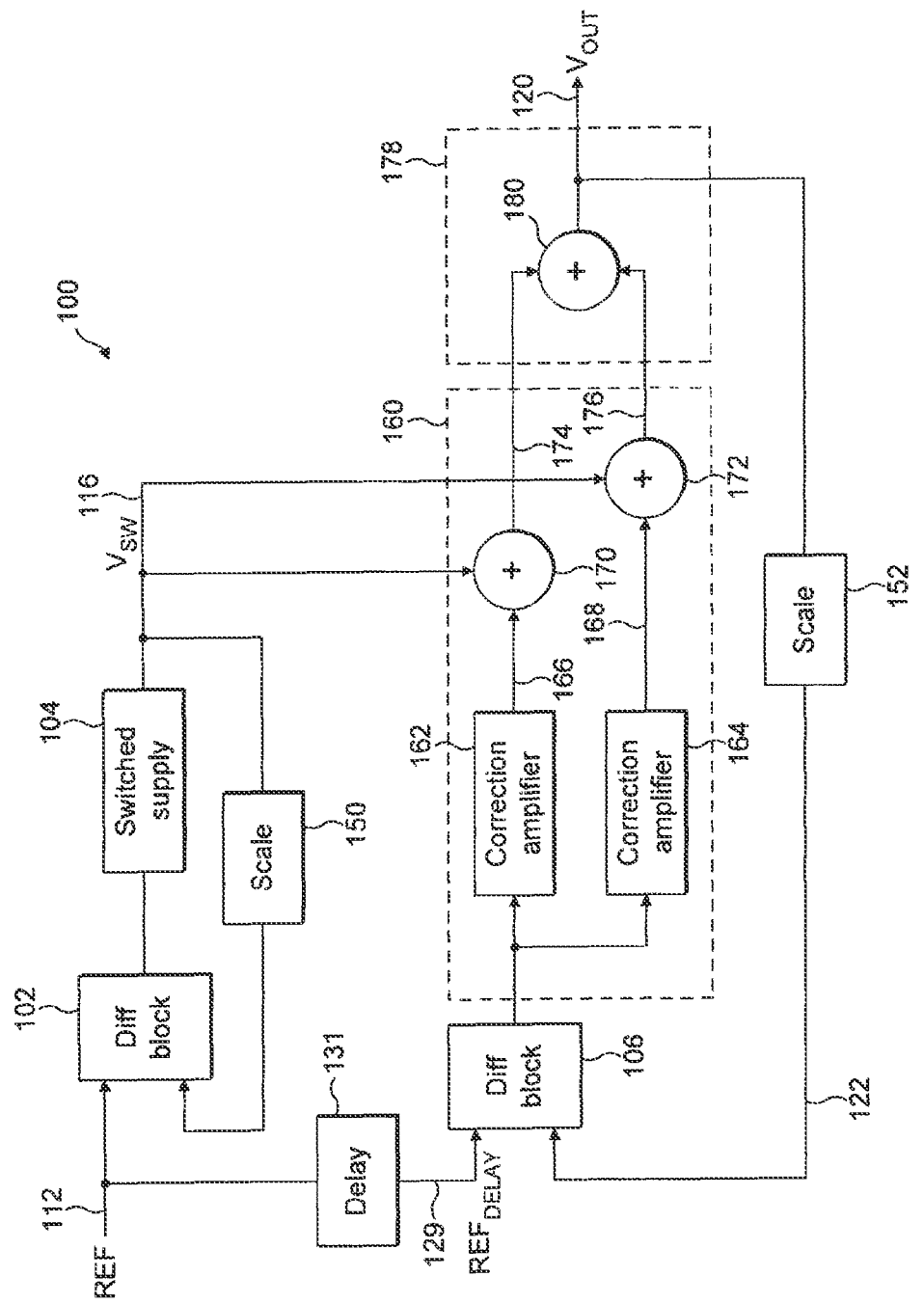
FIG. 1 illustrates an exemplary modulated power supply stage incorporating a correction stage including parallel correction amplifiers in accordance with the invention.

The present invention is now described by way of example with reference to exemplary embodiments. One skilled in the art will appreciate that embodiments are described for ease of understanding the invention, and the invention is not limited to details of any embodiment described. The scope of the invention is defined by the appended claims.

In the following description where the same reference numerals are used in different Figures, they denote an element in one Figure which corresponds to an element in another Figure.

FIG. 1 illustrates an exemplary embodiment of a modulated power supply in accordance with the principles of the invention. The exemplary embodiment is based on the modulated power supply architecture disclosed in United Kingdom Patent No. 2398648. In general the exemplary modulated power supply, generally denoted by reference numeral 100, generates a coarse supply voltage from a switched supply stage. A correction stage, including a correction amplifier, provides high bandwidth correction for the coarse supply voltage, such that the output voltage of the modulated power supply is a corrected voltage.

In accordance with the principles of the invention, as will be discussed further hereinbelow, the correction amplifier of the correction stage is implemented as two or more parallel amplifiers. This allows for improvements in the operation and implementation of the modulated power supply stage, and also improvements in the operation and implementation of the overall architecture in which the modulated power supply stage is implemented.

With further reference to FIG. 1, the modulated power supply stage 100 includes a difference block 102, a switched supply stage 104 and a scale block 150, which in general can be considered a coarse supply stage.

The difference block 102 receives as a first input a reference signal REF on an input line 112. The reference signal REF is representative of a signal to be amplified by an RF amplifier for which the modulated power supply stage is to generate a supply voltage. The reference signal REF may, for example, be a signal representing the envelope of a signal to be amplified by the RF amplifier.

An output of the difference block 102 forms an input to the switched supply stage 104. As known in the art, the switched supply stage is adapted to generate at its output a voltage generated from one of a plurality of fixed voltage levels, in dependence on the signal at its input. The invention is not, however, limited to the use of a switched supply.

The output of the switched supply stage 104 on line 116 is a switched voltage supply $V_{SW}$. The switched voltage supply $V_{SW}$ forms an input to a scale block 150 which scales the signal before providing it as a second input to the difference block 102. Thus the difference block 102 generates an output to the switched supply which represents an error between the (ideal) reference signal and the actual signal at the output of the switched supply. In dependence on this error signal, the switched supply 104 switches the supply signal at its output.

FIG. 1 does not represent a complete implementation of a coarse supply stage, not does it necessarily represent essential elements of a coarse supply stage. The difference block 102, switched supply stage 104 and scale block 150 are illustrative of an exemplary implementation, as known in the art, and which may also require the inclusion of additional functional elements. For example, an output filter may be required at the output of the switched supply stage 104. The invention is not concerned with the implementation of the coarse supply stage, and one skilled in the art will understand that alternatives, modifications or enhancements to the illustrated coarse supply stage are possible.

With further reference to FIG. 1, the modulated power supply stage 100 further includes a difference block 106, a correction stage 160 (described in further detail below), a current combiner stage 178, and a scale block 152, which in general can be considered an error correction path.

The difference block 106 receives as a first input a delayed version of the reference signal REF, denoted $REF_{DELAY}$, on line 129. The delayed reference signal $REF_{DELAY}$ on line 129 is generated by a delay block 131 which receives as its input the reference signal on line 112.

The output of the difference block 106 forms an input to the correction stage 160, which in accordance with the principles of the invention comprises two or more parallel connected correction amplifiers. In the example illustrated, for clarity and simplicity, two parallel correction amplifiers are shown. However in general it will be understood by one skilled in the art that the principles of the invention extend to any number of parallel correction amplifiers n.

The high frequency bandwidth of each of the n amplifiers is greater than the bandwidth of a single amplifier having n times the power handling capabilities.

The exemplary correction stage 160 illustratively comprises a first correction amplifier 162, a second correction amplifier 164, a first combiner 170 and a second combiner 172.

Each of the first and second correction amplifiers 162 and 164 receive as an input the output of the difference block 106. Each of the first and second correction amplifiers generates an output on lines 166 and 168 respectively, which form first inputs to combiners 170 and 172 respectively. In general, for n parallel correction amplifiers, there is provided n combiners. A second input for each of the combiners 170 and 172 is provided by the switched voltage supply $V_{SW}$ on line 116. Each combiner 170 and 172 thus combines the output of a respective correction amplifier 170 and 172 with the switched supply voltage $V_{SW}$ to provide identical corrected supply voltages on output lines 174 and 176 at the outputs of the combiners 170 and 172. The correction stage 160 thus provides a plurality of identical corrected switched supply voltages at its outputs. In general, the correction stage 160 provides n corrected switched supply voltages.

It should be understood that whilst the correction stage generates a plurality of identical corrected supply voltages, this represents an ideal scenario. In practice the plurality of corrected supply voltage may not be identical due to component tolerances or operating conditions for example. The corrected supply voltages can therefore be understood to be substantially identical.

In general, it can be considered that the correction stage provides a plurality of adjusting means each adapted to generate an adjusted selected power supply voltage tracking the reference signal in dependence on the power supply signal from the switched supply and the reference signal.

In a first embodiment, a combiner stage 178 is provided as shown in FIG. 1, which receives as inputs the corrected switched supply voltages on lines 174 and 176. The identical corrected switched supply voltages form respective inputs to a current combiner 180 of the combiner stage 178. The current combiner 180 combines the corrected switched supply voltages to provide as an output a high power corrected switched supply voltage $V_{OUT}$ on line 120. In general the combiner stage 178 combines the current from n corrected switched supply voltages to provide a single output voltage with high current capability.

The output voltage $V_{OUT}$ on line 120 is fed back through the scale block 152 to provide a second input to the difference block 106. Thus the correction amplifiers of the correction stage operate to amplify the error in the output voltage compared with the delayed (ideal) reference signal.

The provision of two or more parallel amplifiers in the correction stage allows for a higher output power without a high frequency bandwidth penalty. To produce the same output power with a single correction amplifier, there would be a high frequency bandwidth penalty.

By the same principle, the provision of two or more parallel amplifiers in the correction stage allows for an extended high frequency bandwidth for the same power. In general, the benefit may be a mix of increased bandwidth and power.

Thus, it is possible (i) to increase power without reducing the high frequency bandwidth, or (ii) increase the high frequency bandwidth without reducing power, or (iii) a combination of both.

In a preferred arrangement, the combiners 170 and 172 are implemented as transformers. The invention has particular advantages when the combiners are implemented as transformers. Each transformer may be made smaller and have increased high frequency bandwidth than if a single high power correction amplifier were used with a single higher power transformer-combiner.

An exemplary implementation using transformers for the combiners 170 and 172, and showing how in such an implementation the function of the combiner 180 may be implemented, is described with reference to FIG. 2.

The output of the correction amplifier 162 on line 166 is provided as an input to a first tap of a first winding of a transformer 202. The second tap of the first winding of the transformer 202 is connected to electrical ground. A first tap of a second winding of the transformer 202 is connected to the switched supply voltage $V_{SW}$ on line 116. The second tap of the second winding of the transformer 202 is connected to the output signal line 174. The provision and connection of the transformer in this way results in the corrected switched supply voltage being generated at the second tap of the second winding, and thus on line 174.

The output of the correction amplifier 164 on line 168 is provided as an input to a first tap of a first winding of a transformer 204. The second tap of the first winding of the transformer 204 is connected to electrical ground. A first tap of a second winding of the transformer 204 is connected to the switched supply voltage $V_{SW}$ on line 116. The second tap of the second winding of the transformer 204 is connected to the output signal line 176. The provision and connection of the transformer in this way results in the corrected switched supply voltage being generated at the second tap of the second winding, and thus on line 176.

In this way the correction stage 160 generates the two identical corrected switched supply voltages on lines 174 and 176.

Figure 2:
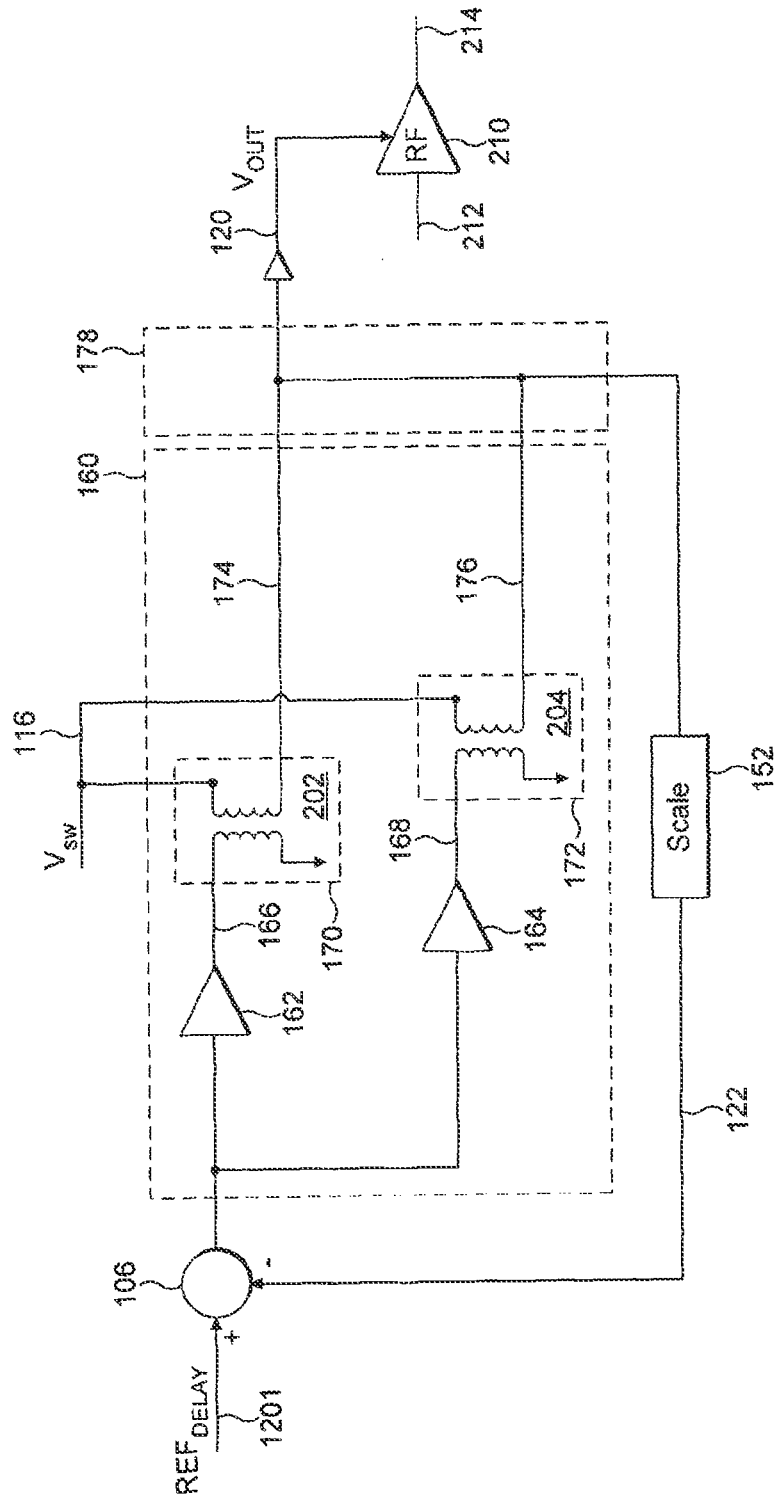
FIG. 2 illustrates an example implementation of the correction stage of FIG. 1 for delivering a power supply voltage using transformer combiners.

The exemplary combining stage 178 of FIG. 2, which receives the corrected switched supply voltages, combines the current from the corrected switched supply voltages by electrically connecting the outputs of the transformers. Thus it can be seen that the two output lines are connected together, and the corrected switched supply voltage output $V_{OUT}$ is provided on line 120. This principle as illustrated in FIG. 2 extends to n transformers, and the electrical connection of n transformer outputs to provide an overall output.

For completeness, in FIG. 2, there is illustrated an RF amplifier 210 to which the modulated supply voltage stage may be arranged to provide a supply voltage. The supply voltage is provided by the corrected switched supply voltage on line 120. The RF amplifier, illustratively, amplifies an input signal on line 212 and provides an amplified output on line 214.

Each correction amplifier 162 and 164 (and associated transformer windings) may be a push-pull arrangement fed from two halves of a supply rail. However for the purposes of illustration and simplicity, the invention is described in FIG. 2 on the basis of a single supply rail.

In accordance with the general benefits of the invention as mentioned above, the arrangement of FIG. 2, where respective transformer output signals on lines 174 and 176 are combined to feed a single RF amplifier, allows increased bandwidth for a given power level to be achieved due to reduced parasitic elements (the leakage inductance of the transformer and inter-winding capacitance), since the transformer can be made physically smaller. Alternatively, it is possible to provide more power without degrading bandwidth. To achieve this, n transformers (driven by n correction amplifiers) of the same size and bandwidth as a single stage design can be used in parallel to feed a single high-powered RF amplifier.

However, as known in the art, there is a limit as to how much power a single RF amplifier can handle, because of limitations associated with a transistor on which the RF amplifier is based. For this reason, it is known in the art of high power amplification to split the RF amplifier into multiple stages, and provide two or more RF amplifiers in parallel, connected to amplify the same input signal and have their outputs combined. Such a parallel amplifier arrangement can be advantageously combined with the present invention.

In a second embodiment, the arrangement of FIG. 1 and described above is modified. This is illustrated with reference to FIG. 3. Only the portions of FIG. 1 necessary to understand the modification are illustrated in FIG. 3.

Figure 3:
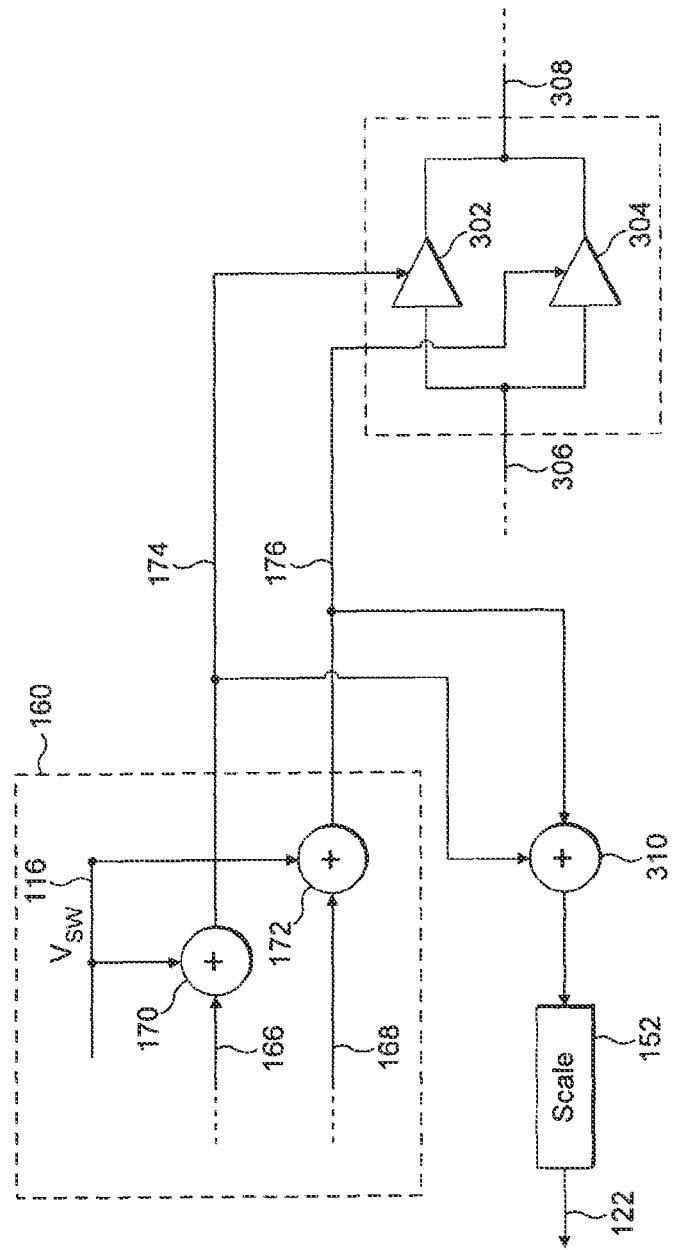
FIG. 3 illustrates an example implementation of the correction stage of FIG. 1 for delivering power supply voltages to parallel RF amplification stages

With reference to FIG. 3, the combining stage 178 of FIG. 1 is dispensed with. The RF amplifier to which the modulated power supply stage provides a power supply voltage is modified, in accordance with known principles, as two-stage parallel RF amplifiers 302 and 304. The two RF amplifiers 302 and 304 are connected to amplify the same input signal on line 306, and combine (by means not shown but within the scope of a skilled person) their outputs onto an output line 308.

The two identical error corrected switched supply voltages on lines 174 and 176 are respectively connected to the power supply terminals of the RF amplifiers 302 and 304. Thus in this second embodiment the corrected supply voltages from the two correction amplifiers are not combined, but delivered directly to respective RF amplifiers. In general, n corrected supply voltages may deliver supply voltages to n parallel RF amplifiers. Further modifications may be possible, e.g. with one or more sub-sets of the n corrected supply voltages being combined for delivery to one of the plurality of RF amplifiers.

In an arrangement in accordance with the second embodiment as shown in FIG. 3, it is necessary for the individual corrected voltage signals from the n correction amplifiers to be combined in order to provide the signal for the feedback path to provide the second input to the difference block 106. Thus there is illustrated in FIG. 3 a voltage combiner 310 which receives as inputs the corrected voltage signals on lines 174 and 176, and provides a combined signal to the scale block 152 (referring to the example of FIG. 1).

In the exemplary arrangement of FIG. 3 the RF amplifiers 302 and 304 are preferably identical.

A further advantage can be achieved by the arrangement of the second embodiment as illustrated in FIG. 3. It is desirable for the path length between the output of the voltage supply modulator and the supply input to the RF transistors to be as short as possible. By using a distributed correction amplifier, as described herein, the path length to the RF amplifier can be kept shorter than if a single high power correction amplifier were used. This leads to improved high frequency performance.

The reduction in path length can be achieved by controlling where the physical outputs and physical inputs of the devices are located, for example, in an arrangement where the modulated power supply and the amplification stage are provided on separate ICs.

The invention has been described herein by way of reference to particular examples and embodiments, for the purposes of illustrating the invention and its embodiments. The invention is not limited to the specifics of any embodiment descried herein. Any feature of any embodiment may be implemented in combination with features of other embodiments, no embodiment being exclusive. The scope of the invention is defined by the appended claims.

The invention claimed is:

1. A power supply stage comprising:
   a stage configured to generate an intermediate supply signal in dependence on a reference signal representing a desired power supply;
   a plurality of correction amplifiers, each adapted to generate a respective corrected signal tracking the reference signal, and wherein the corrected signal is based on a feedback signal;
   at least a first combiner adapted to combine each of the respective corrected with the intermediate supply signal to generate a plurality of adjusted signals, wherein each of the adjusted signals provides power to a respective power amplifier; and
   at least a second combiner adapted to combine the plurality of adjusted signals to generate the feedback signal.

2. The power supply stage according to claim 1, wherein at least the first combiner comprises a current combiner.

3. The power supply stage according to claim 1, wherein the respective power amplifier is a radio frequency amplifier.

4. The power supply stage according to claim 1, wherein the stage configured to generate the intermediate supply signal is adapted to select one of a plurality of power supply voltages in dependence on the reference signal.

5. The power supply stage according to claim 1, wherein each of the correction amplifiers receives an input a signal representing a difference between the reference signal and the sum of the adjusted signals.

6. The power supply stage according to claim 1, wherein at least the first combiner comprises a transformer.

7. The power supply stage according to claim 6, wherein each of the corrected signals is connected to a tap of a respective primary winding of each transformer, and the intermediate supply signal is connected to a tap of a secondary winding of each transformer and each of the plurality of adjusted signals are formed on another tap of the secondary winding of each transformer.

8. The power supply stage according to claim 6, wherein the combiner comprises a connection between taps of transformers on which the adjusted signals are formed.

9. The power supply stage according to claim 1, wherein the intermediate supply signal is a voltage supply signal.

10. A method of generating an output supply signal comprising:
    generating an intermediate supply signal in dependence on a reference signal representing a desired power supply;
    generating a plurality of corrected signals tracking the reference signal, and wherein each of the corrected signals is based on a feedback signal;
    combining each of the respective corrected signal with the intermediate supply signal to generate a plurality of adjusted signals, wherein each of the plurality of adjusted signal is input to a respective power amplifier; and
    combining the plurality of adjusted signals to generate the feedback signal.

11. The method of claim 10, wherein the power amplifiers are parallel connected amplifiers.

12. The method of claim 10, wherein the step of generating the intermediate supply signal comprises selecting one of a plurality of power supply voltages in dependence on the reference signal.

13. The method of claim 10, wherein the corrected signals represent an error between the reference signal and the sum of the adjusted signals.

* * * * *